United States Patent
Muto et al.

[11] Patent Number: 5,986,218
[45] Date of Patent: *Nov. 16, 1999

[54] CIRCUIT BOARD WITH CONDUCTOR LAYER FOR INCREASED BREAKDOWN VOLTAGE

[75] Inventors: Hirotaka Muto; Toshinori Kimura; Haruhisa Fujii; Kazuharu Kato, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/652,291

[22] Filed: Jul. 10, 1996

[30] Foreign Application Priority Data

Nov. 8, 1995 [JP] Japan .................................. 7-290013

[51] Int. Cl.$^6$ .................................................. H01R 9/09
[52] U.S. Cl. ........................................... 174/261; 174/250
[58] Field of Search ..................................... 174/250, 261, 174/254, 72 A, 260; 361/748, 803, 767

[56] References Cited

U.S. PATENT DOCUMENTS

| | | | |
|---|---|---|---|
| 3,487,541 | 1/1970 | Bosewell | 29/832 |
| 4,164,071 | 8/1979 | Kruzich | 29/831 |
| 4,295,184 | 10/1981 | Roberts | 361/774 |
| 4,322,777 | 3/1982 | Ueta et al. | 361/748 |
| 4,706,165 | 11/1987 | Takenaka et al. | 361/767 |
| 5,296,649 | 3/1994 | Kosuga et al. | 174/250 |
| 5,373,112 | 12/1994 | Kamimura et al. | 174/250 |
| 5,679,929 | 10/1997 | Greenfield et al. | 174/261 |
| 5,750,271 | 5/1998 | Kuramoto et al. | 428/624 |

FOREIGN PATENT DOCUMENTS

| | | |
|---|---|---|
| 60-4154 | 1/1985 | Japan . |
| 159986 | 3/1989 | Japan . |
| 1120886 | 5/1989 | Japan . |

*Primary Examiner*—Dean A. Reichard
*Assistant Examiner*—Kamand Cuneo
*Attorney, Agent, or Firm*—Leydig, Voit & Mayer, Ltd.

[57] ABSTRACT

A circuit board includes an insulating substrate having opposed first and second surfaces and a thickness; and first and second conductive layers disposed on the first and second surfaces of the insulating substrate, respectively, wherein the first conductive layer has an end surface projecting outwardly from the first conductive layer in a direction generally parallel to the first surface of the insulating substrate, and a contact surface in contact with the insulating substrate and joining the end surface at a junction, wherein the end surface is spaced from the first surface of the insulating substrate except at the junction.

6 Claims, 17 Drawing Sheets

"rounded edge"

CIRCUIT BOARD WITH CONDUCTOR LAYER FOR INCREASED BREAKDOWN VOLTAGE

BACKGROUND OF THE INVENTION

1. Field of the Invention

The present invention relates to a circuit board for mounting a component such as a semiconductor electronic device and, more particularly, to a circuit board for use, at high voltage.

2. Description of the Related Art

Circuit boards constructed with a metal plate such as copper bonded to a base substrate of alumina or aluminum nitride are now widely used in a power transistor module or a switching power supply module. Various structures of circuit boards of this type, and various production techniques thereof, are known in the art. Some of these are disclosed for example in: (1) Print Circuit Board Handbook, Second Edition, Completely Revised, Japan Print Circuit Industry Association, 1987; (2) Japanese Patent Publication No. 60-4154 (1985); and (3) Journal of the Institute of Metals, Vol. 22, No. 1, pp. 3–7, 1983. FIGS. 17A and 17B illustrate an example of a conventional aluminum nitride circuit board, wherein FIG. 17A is a plan view and FIG. 17B is a cross-sectional view taken along the line 17B—17B of FIG. 17A. In FIGS. 17A and 17B, a copper plate is bonded to a surface of an aluminum nitride substrate 1 serving as a ceramic substrate so as to form a collector electrode 2. The other surface opposite to the collector electrode 2 is entirely covered with another copper plate so as to form a ground electrode 3. A power semiconductor device such as an insulating gate bipolar transistor (hereafter referred to as an IGBT) 4 is attached to the collector electrode 2. On the aluminum nitride substrate 1, there is also a copper plate bonded to an area adjacent to the collector electrode 2 so as to form an emitter electrode 5. In the final product form, the circuit board is placed in a power module package in such a manner that the ground electrode 3 is connected to a block serving as a heat sink (not shown) or the like. That is, the circuit board, on which the semiconductor device 4 is mounted, is placed in a plastic package, and the inside of the package is filled with a resin such as silicone gel or epoxy resin (not shown) so that the surfaces of the circuit board are covered with the resin.

FIG. 18 illustrates an example of a production process flow of a circuit board according to a conventional technique. In this specific example, an electrode pattern is formed by means of etching. First, an aluminum nitride substrate 1 is prepared. A soldering material to be used to bond copper plates 6 and 7 to the aluminum nitride substrate 1 is printed on the surfaces of the aluminum nitride substrate 1. The thickness of the copper plates 6 and 7 is typically of the order of 0.3 mm. Copper plates 6 and 7 are placed on the aluminum nitride substrate 1 and heated at a high temperature so that these copper plates 6 and 7 are bonded to the aluminum nitride substrate 1. A resist 8 is then coated on both surfaces, and exposed to light so as to form a predetermined pattern in the resist. After developing the resist, the copper plates are etched using the resist pattern as a mask so as to remove unnecessary parts of the copper plates. The surfaces of the copper electrodes are polished, and plated with Ni. Thus, a complete circuit board is obtained.

FIG. 19 illustrates another example of a production process flow of a circuit board according to a conventional technique. In the previous example described above, the electrode patterns are obtained by etching the copper plates 6 and 7 which have been previously bonded to both surfaces of the aluminum nitride substrate 1. In the present example, unlike the previous one, copper plates are first formed into predetermined patterns and then bonded to a ceramic substrate. The patterning of copper plates into electrode patterns can be performed by means of punching or etching. After the patterning process, a soldering material for use to bond the electrode patterns to the ceramic substrate is coated on the ceramic substrate. The copper electrodes are then placed on the ceramic substrate, and heated at a high temperature so that the copper electrodes are bonded to the substrate. Thus, a complete circuit board is obtained.

When an IGBT is in an on-state, a high current of the order of 100 A flows through the IGBT. On the other hand, when the IGBT is in an off-state, a high voltage of the order of 2 kV or greater is applied to the IGBT. Thus, a high voltage appears between the collector electrode 2 and the ground electrode 3 on the circuit board. Therefor, a circuit board for mounting a power semiconductor device such as an IGBT should meet the following requirements:

1) The circuit board should have as good heat removal characteristics as possible to prevent the increase in temperature. To achieve this purpose, aluminum nitride having a high thermal conductivity is preferably employed as the substrate material.

2) The copper plates and the aluminum nitride substrate should be thin enough to prevent generation of cracks during heat cycles due to stress caused by the difference in expansion coefficients of the copper plates and the substrate.

3) The electrode patterns of the circuit board should be designed so that no discharge occurs at any portion of the electrode patterns during operation of the semiconductor device.

As a result of recent advances in semiconductor device technology, a circuit board for mounting a semiconductor device designed to operate at a voltage greater than 3 kV has been required. The increase in operating voltage of semiconductor devices has brought about problems of dielectric breakdown and partial discharging, which are not significant problems in conventional circuit boards. These problems cause a great reduction in reliability of circuit boards. The partial discharge refers to a discharge that occurs at a localized portion of a circuit board where a high electric field is concentrated. The partial discharge generates noise which can cause a semiconductor device mounted on a circuit board to operate in an erroneous manner. If partial discharge continues for a long time, degradation occurs in an insulating material, which can finally result in dielectric breakdown. If dielectric breakdown occurs in a circuit board, an apparatus or system including that circuit board can no longer operate in a correct manner. Thus, with the increase in the operating voltage of semiconductor devices, there is an increasing need for a circuit board having a high dielectric breakdown voltage and also having a high partial discharge voltage.

In conventional circuit boards, semiconductor devices mounted thereon are not operated at a very high voltage, and thus the partial discharge is not a significant problem. Therefore, the partial discharge is not taken into account in the design of the conventional circuit boards. The inventors of the present invention have investigated the effects of the partial discharge on the circuit board. First, the voltage at which a partial discharge starts was measured for conventional circuit boards whose patterns were formed by means of etching. In the case of an aluminum nitride substrate having a thickness of 1.0 mm, a partial discharge was observed to start at a voltage as low as about 5 kV. To find the cause of the low starting voltage of partial discharge, the cross-section at an end of the electrode pattern was observed. The observation has revealed that the electrode pattern 2 has a very sharp edge 2a in a portion in contact with the ceramic substrate 1 as shown in FIG. 20. In the case of a copper electrode pattern having a thickness of 0.3 mm on an aluminum nitride substrate having a thickness of 1.0 mm, the radius of curvature of the sharp edge 2a is as small as 0.01 mm. Since the electrode 2 has a certain finite thickness, the electrode 2 has another sharp edge 2b on the side opposite to the sharp edge 2a in direct contact with the substrate 1. The etching process generally occurs in an anisotropic fashion, and thus the copper pattern is etched not only in a direction across its thickness but also in a lateral direction. As a result, the etched copper pattern has a sharp edge in cross section in a portion in contact with the ceramic substrate 1. This phenomenon is well known in the art as described for example in Print Circuit Board Handbook, Second Edition, Completely Revised, Japan Print Circuit Industry Association, 1987. However, little has been known about the magnitude of the electric field at the sharp edge and its effect on the discharge. To obtain knowledge about these, the inventors of the present invention have performed numerical analysis on the electric field at the sharp edge 2a in contact with the substrate 1. The result shows that a very high electric field can occur at such a sharp edge. When a high voltage, for example 5 kV, is applied to the electrode 2, the maximum electric field near the edge 2a can be as large as 80 kV/mm. This high electric field near the edge 2a causes a reduction in the starting voltage of partial discharge. Thus, the analysis has shown that the low starting voltage of partial discharge in the conventional circuit boards is due to the concentration of the electric field at the sharp edge of the electrode pattern.

In an electrode pattern on the conventional circuit board, as described above, a very sharp edge is produced at an end portion in contact with an insulating substrate. The sharp edge of the electrode facing the ground electrode causes a concentration of lines of electric force at that edge, and thus a high electric field is produced there.

A discharge occurs in a gas space near the sharp edge of the electrode pattern. This means that if the gas space, in which a high electric field is present, is eliminated, then the circuit board will have a higher starting voltage in discharge. To eliminate the gas space, the circuit board is usually housed in a case filled with a silicone gel 9 as shown in FIG. 21. However, in some cases, a small void 10 is produced in the gel 9. The electric field in the void 10 is generally higher than that in the dielectric surrounding the void 10. Therefore, if such a void is present near the pattern electrode 2 where an electric field is concentrated to a high level, a discharge is induced more easily, which results in a reduction in the reliability. Thus, the generation of such a void 10 in a gel 9 in a high electric field region is another problem in the conventional circuit boards.

SUMMARY OF THE INVENTION

It is a general object of the present invention to solve the above problems. More specifically, it is an object of the present invention to provide a circuit board having a high starting voltage in partial discharge and a high dielectric breakdown voltage. It is another object of the present invention to provide a method of producing such a circuit board.

In order to achieve the above objects, according to an aspect of the present invention, there is provided a circuit board comprising: an insulating substrate; and conductive layers disposed on both surfaces of the insulating substrate wherein at least one of the conductive layers is an electric circuit pattern, said conductive layer serving as the electric circuit pattern having a shape in cross section in which an end of the conductive layer's contact face in contact with the insulating substrate is located at an inner position relative to the outermost end of the conductive layer.

According to another aspect of the present invention there is provided a circuit board comprising: an insulating substrate; conductive layers disposed on both surfaces of the insulating substrate wherein at least one of the conductive layers is an electric circuit pattern; a recessed groove in the form of a frame provided on the insulating substrate, the groove being located outside the conductive layer serving as the electric circuit pattern and surrounding the conductive layer serving as the electric circuit pattern; and a conductive film disposed on the insulating substrate, the conductive film covering the bottom surface of the groove and the area between the conductive layer serving as the electric circuit pattern and the groove.

According to still another aspect of the present invention, there is provided a circuit board comprising: an insulating substrate; and conductive layers disposed on both surfaces of the insulating substrate, wherein at least one of the conductive layers is an electric circuit pattern and the conductive layer serving as the electric circuit pattern is embedded in the insulating substrate so as to be partially exposed to the outside.

According to a further aspect of the present invention, there is provided a method of producing a circuit board, the circuit board comprising: an insulating substrate; and conductive layers disposed on both surfaces of the insulating substrate wherein at least one of the conductive layers is an electric circuit pattern, wherein the conductive layer serving as the electric circuit pattern has a shape in cross section in which an end of the conductive layer's contact face in contact with the insulating substrate is located at an inner position relative to the outermost end of the conductive layer, the method including the step of electrolytic polishing a periphery of the conductive layer serving as the electric circuit pattern so as to remove an edge portion of the contact face.

DETAILED DESCRIPTION OF THE PREFERRED EMBODIMENTS

Embodiment 1

Figure 1:
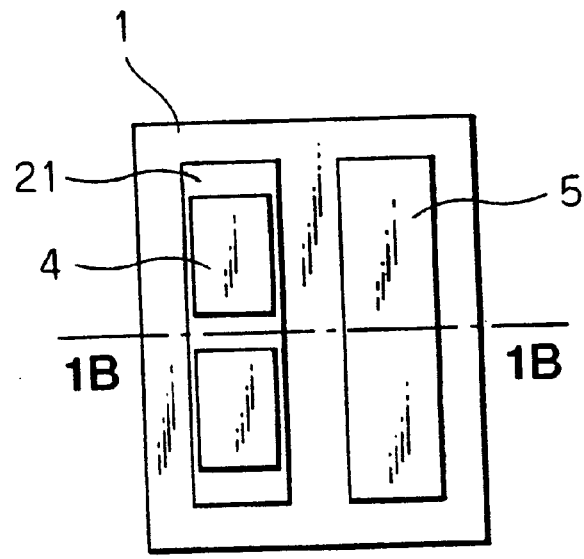
FIG. 1A is a plan view illustrating a first embodiment of a circuit board according to the present invention.
FIG. 1B is a cross-sectional view of the circuit board of FIG. 1A, which is taken along the line 1B—1B of FIG. 1A so that the cross sections of electrode patterns are shown.
FIG. 1C is an enlarged fragmentary cross-sectional view of FIG. 1B.
Figure 1:
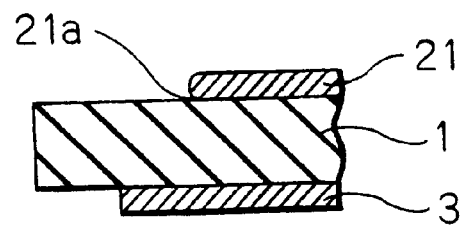
Figure 1:
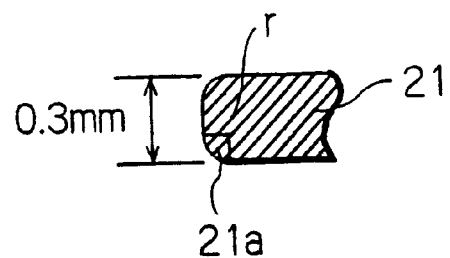

FIG. 1A is a plan view of a first embodiment of a circuit board according to the present invention, and FIG. 1B is a cross-sectional view which is taken along the line 1B—1B of FIG. 1A so that cross sections of electrode patterns are shown. FIG. 1C is an enlarged fragmentary cross-sectional view of FIG. 1B. In these figures, an insulating substrate 1 is made up of, for example, aluminum nitride having a thickness of, for example, 1 mm. An electric circuit pattern 21 of a conductive material is formed on a first surface of the insulating substrate 1. In this specific example, this electric circuit pattern 21 forms a collector electrode which is subjected to a high voltage during operation of a device. On the other surface of the insulating substrate 1, there is provided a conductive layer serving as a ground electrode 3. Furthermore, a conductive layer serving as an electric circuit pattern 5 is also provided on the first surface of the insulating substrate 1. In this specific example, the electric circuit pattern 5 forms an emitter electrode. The ground electrode 3 is connected to a block serving as a heat sink block (not shown). The conductive layers forming the respective electric circuit patterns 21 and 3 are made of a copper plate having a thickness of 0.3 mm. The end portions of the electric circuit pattern 21 are formed into a round shape so that the end 21a of the surface in contact with the substrate 1 is located at a relatively inner position with respect to the outermost end portion of the electric circuit pattern 21. A semiconductor device 4 is attached to the above-described electric circuit pattern 21 on the circuit board.

Figure 2:
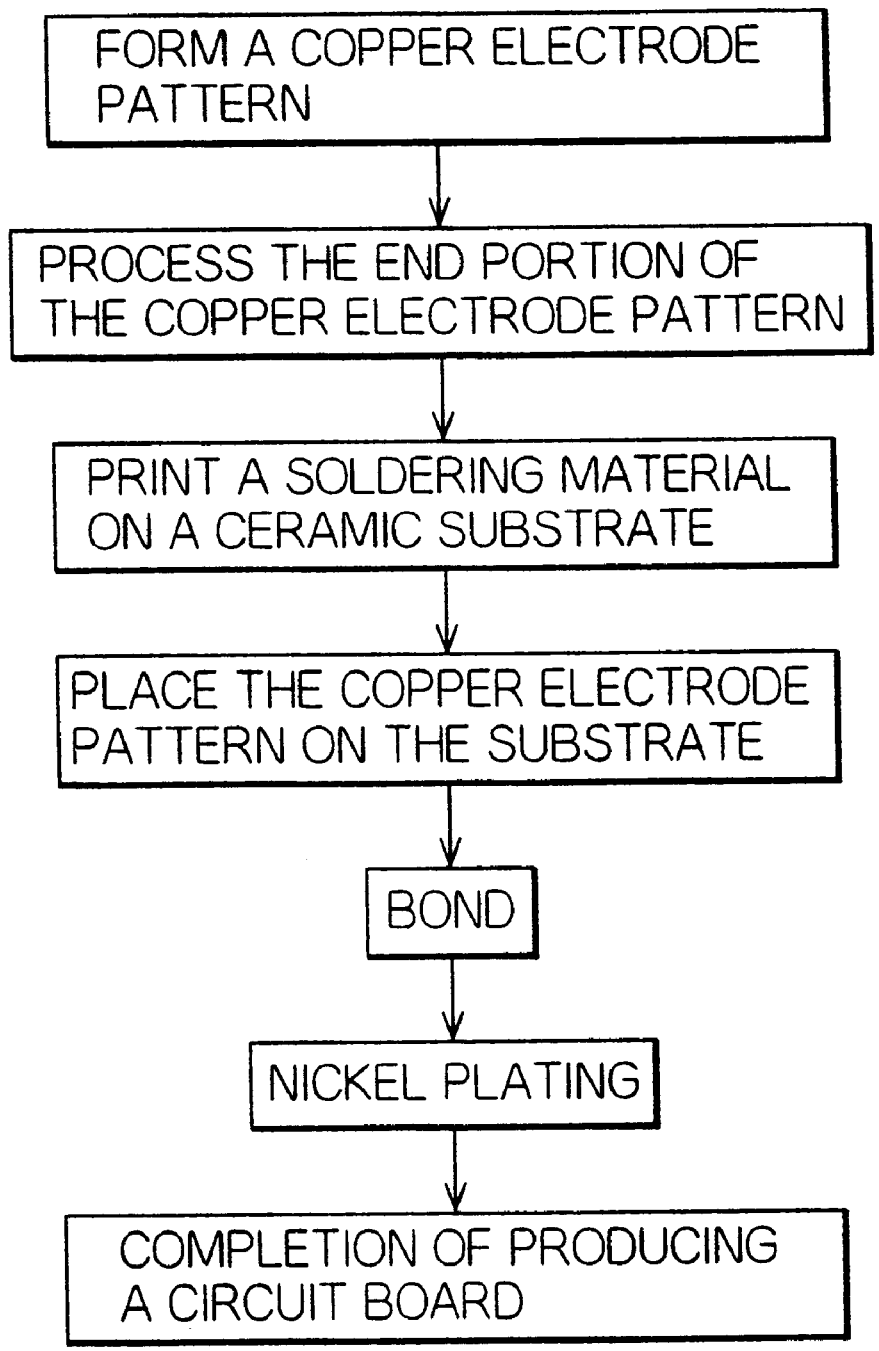
FIG. 2 is a block diagram illustrating a method of producing a circuit board, according to the first embodiment of the present invention.

Referring to a block diagram shown in FIG. 2, a method of producing the circuit board will be described below. In this production method, electric circuit patterns are first formed and then the sharp edges on them are rounded. After that, the electric circuit patterns are bonded to a substrate. In this specific embodiment, the edges 21a of the electric circuit pattern 21 serving as the collector electrode are shaped into a round form before bonding the electric circuit pattern 21 to the substrate. This can be accomplished by cutting the edges of the pattern before the bonding process. Alternatively, the rounding may also be achieved by means of electrolytic polishing. The bonding of the electric circuit patterns can be performed using a known technique such as that disclosed in Japanese Patent Publication No. 60-4154 in which bonding is accomplished by means of reaction with ceramic at a high temperature.

In this production method of the invention, electric circuit patterns are processed before bonding them to a ceramic substrate such as an aluminum nitride substrate thereby ensuring that a circuit board can be formed without damaging the ceramic substrate.

When the electrolytic polishing is employed, sharp portions such as the edge 21a at which electric field is concentrated to a high level are polished at a higher rate than other portions. Thus, this technique is suitable to shape the sharp edges into a round form. The electrolytic polishing for a copper pattern for example having a dimension of 100 mm×10 mm×1 mm can preferably be performed in an aqueous solution of phosphoric acid ($H_3PO_4$, 85%) with the copper patterns acting as anodes at a current of 20 A for about 1 min so that the electrode edge 21a is shaped into a round form having a curvature radius of 0.1 mm.

Figure 3:
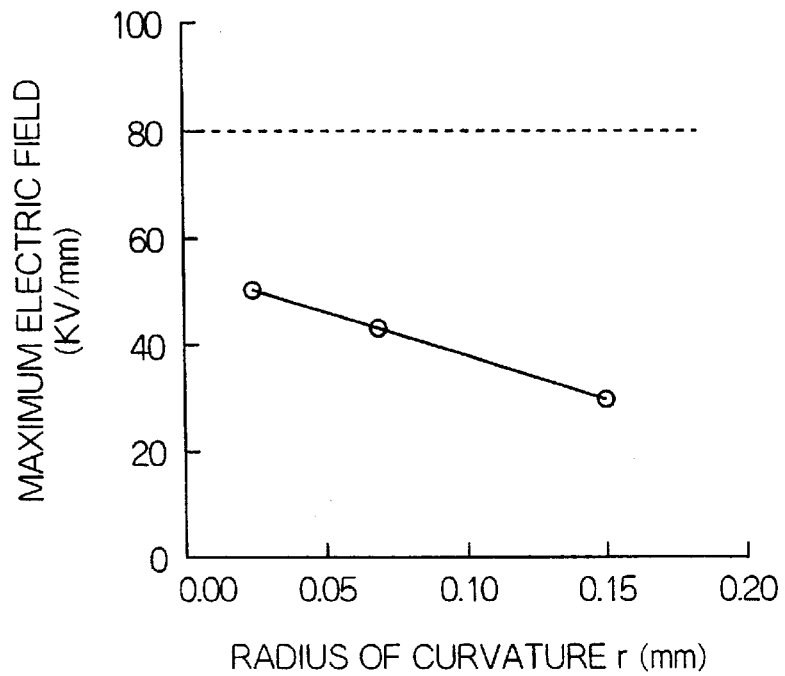
FIG. 3 is a graph illustrating the reduction in the electric field, achieved in the circuit board according to the first embodiment of the present invention.

To know the effects of the shape in cross section of an electrode pattern on the maximum electric field, the maximum electric field at the edge 21a of the contact face is calculated for various curvature radii. The results are shown in FIG. 3. In FIG. 3, the broken line denotes the electric field calculated for the conventional structure shown in FIG. 20 assuming that the curvature radius r is 0.01 mm. As can be seen from FIG. 3, the maximum electric field decreases with the increasing curvature radius r. This means that the rounding is very effective to suppress the concentration of electric field.

In the present embodiment, as described above, the electrodes are processed so that their edges have a round shape in cross section thereby suppressing the concentration of lines of electric force or electric field at the edges. Thus it becomes possible to increase the starting voltage of partial discharge and the dielectric breakdown voltage. As a result, the erroneous operations of the semiconductor device 4 are prevented and the reliability of the circuit board is improved.

The rounding process may also be possible after bonding copper plates to a substrate and etching copper plates into electric circuit patterns. In this case, sharp edges of the etched copper patterns may be cut by using a numerically controlled machine or by means of an electrolytic polishing technique.

Embodiment 2

Figure 4:
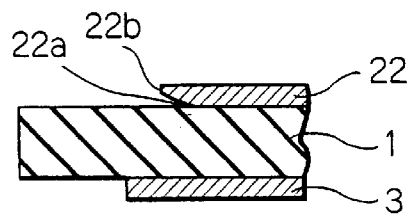
FIG. 4A is a cross-sectional view of a circuit board according to a second embodiment of the present invention, in which cross sections of electrode patterns are shown.
FIG. 4B is an enlarged fragmentary cross-sectional view of FIG. 4A.
Figure 4:
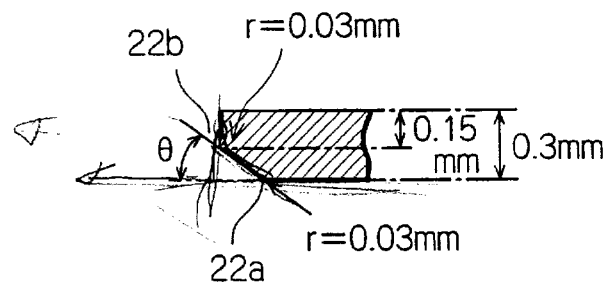

FIG. 4A is a cross-sectional view illustrating cross sections of electrode patterns of a circuit board according to a second embodiment of the present invention. FIG. 4B is an enlarged fragmentary cross sectional view of FIG. 4A. In this second embodiment, an electric circuit pattern 22 serving as a collector electrode formed on one surface of an insulating substrate 1 is shaped in such a manner that the end portion of the electric circuit pattern 22 has a slanted plane so that the end of the pattern's face in contact with the insulating substrate 1 is located at a laterally-inner position.

Figure 20:
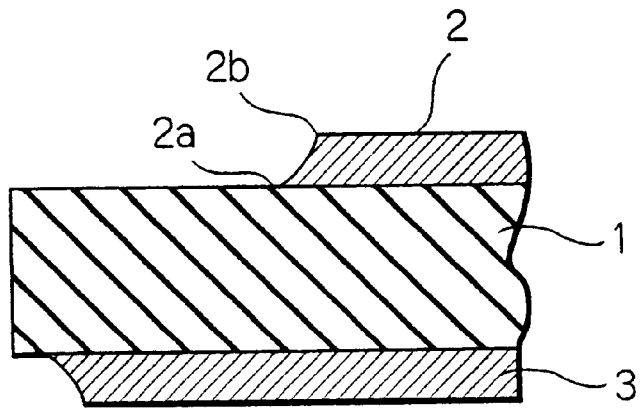
FIG. 20 is an enlarged cross-sectional view illustrating end portions of electrode patterns of the conventional circuit board.
Figure 21:
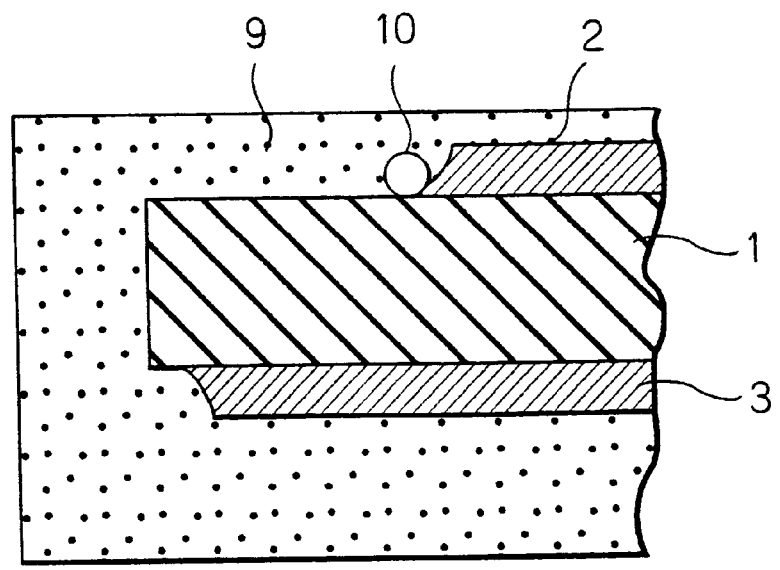
FIG. 21 is an enlarged cross-sectional view illustrating end portions of electrode patterns of the conventional circuit board wherein a void is present in silicone gel.

More particularly, in this second embodiment, each end portion 2a of the pattern in the conventional structure shown in FIG. 20 is cut into slanted faces so that the end portions of the contact face are located at laterally-inner positions. In this configuration, two corners are formed at each end portion. The corner in direct contact with the insulating substrate 1, or the end of the contact face, is denoted by 22a and the other corner is denoted by 22b. In contrast to the conventional structure in which a high electric field is concentrated at the edge 2a, the edge in the structure according to the present embodiment has such a shape so that the distance between the electric circuit pattern 22 serving as the collector electrode and the ground electrode 3 gradually increases with the position of the electric circuit pattern 22 taken in an outward direction and thus the concentration of the electric field is relaxed.

Furthermore, in this second embodiment, the shaping process of the end portions of the electrode pattern into slanted planes can be performed more easily than the shaping into curved faces employed in the first embodiment while providing a similar effect of suppressing the concentration of electric field.

Figure 5:
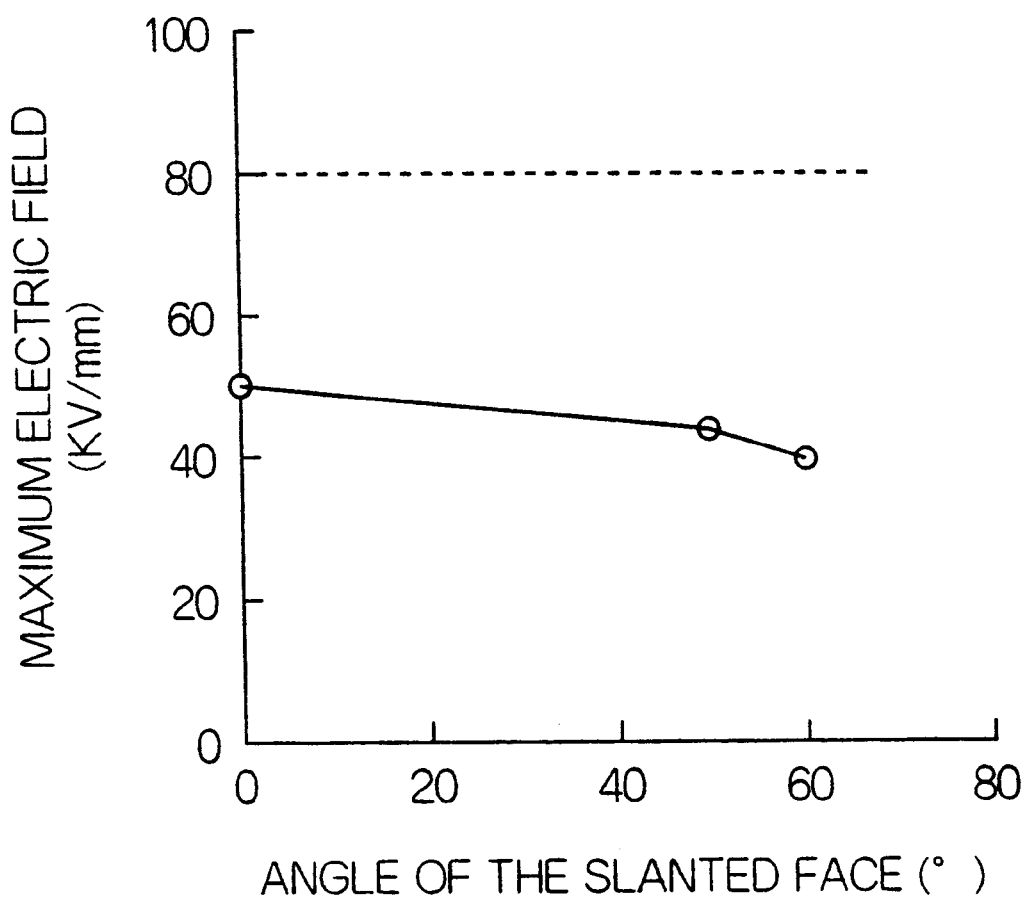
FIG. 5 is a graph illustrating the effects of reducing the electric field, achieved in the circuit board according to the second embodiment of the invention.

FIG. 5 illustrates the effects of the present embodiment of the invention, in which the calculated electric filed at the end of the contact face 22a is plotted as a function of the angle of the edge plane of the electrode pattern. In this calculation, it is assumed that the thickness of the electrode is 0.3 mm, the thickness of the portion of the electrode pattern which is shaped so as to have a slanted face is 0.15 mm, and the curvature radii r of corners 22a and 22b are 0.03 mm. In FIG. 5, the broken line denotes the electric field calculated for the conventional structure including the sharp edge 2a (assumed to have a curvature radius r of 0.01 mm). As can be seen from FIG. 5, the maximum electric field at the portion 22a decreases with the decreasing angle of the slanted plane with respect to the surface of the insulating substrate 1.

Embodiment 3

Figure 6A:
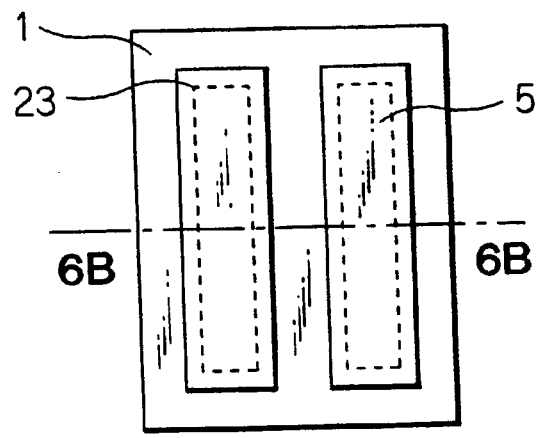
FIG. 6A is a plan view of a circuit board according to a third embodiment of the invention.
Figure 6B:
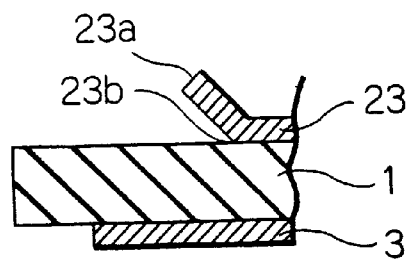
FIG. 6B is a cross-sectional view of the circuit board of FIG. 6A, which is taken along the line 6B—6B of FIG. 6A so that the cross sections of the electrode patterns are shown.
Figure 6C:
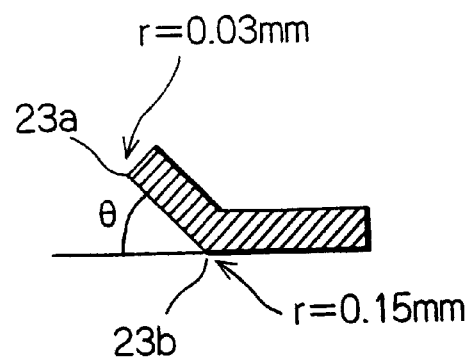
FIG. 6C is an enlarged fragmentary cross-sectional view of FIG. 6B.

FIG. 6A is a plan view of a circuit board according to a third embodiment of the invention. FIG. 6B is a cross-sectional view taken along the line 6B—6B of FIG. 6A so that cross sections of the electrode patterns are shown. FIG. 6C is an enlarged fragmentary cross sectional view of FIG. 6B. The end portions of an electric circuit pattern 23 serving as a collector electrode are bent in a direction opposite to an insulating substrate 1. In this structure, the end portions 23a having sharp edges of the electric circuit pattern 23 are located far from the ground electrode 3 compared to the other portions of the electrode and thus the electric field at the end portions 23a of the pattern decreases. The bending of the electric circuit pattern 23 produces a bending corner 23b in contact with the insulating substrate 1, which can cause concentration of electric field. This problem can be avoided by bending the end portions of the electrode by employing, for example, a press working technique so that the bending corner 23 has a large curvature radius. This structure can provide a lower maximum electric field than the conventional structure in which the end portion 23a of the pattern is in contact with the insulating substrate 1.

Figure 7:
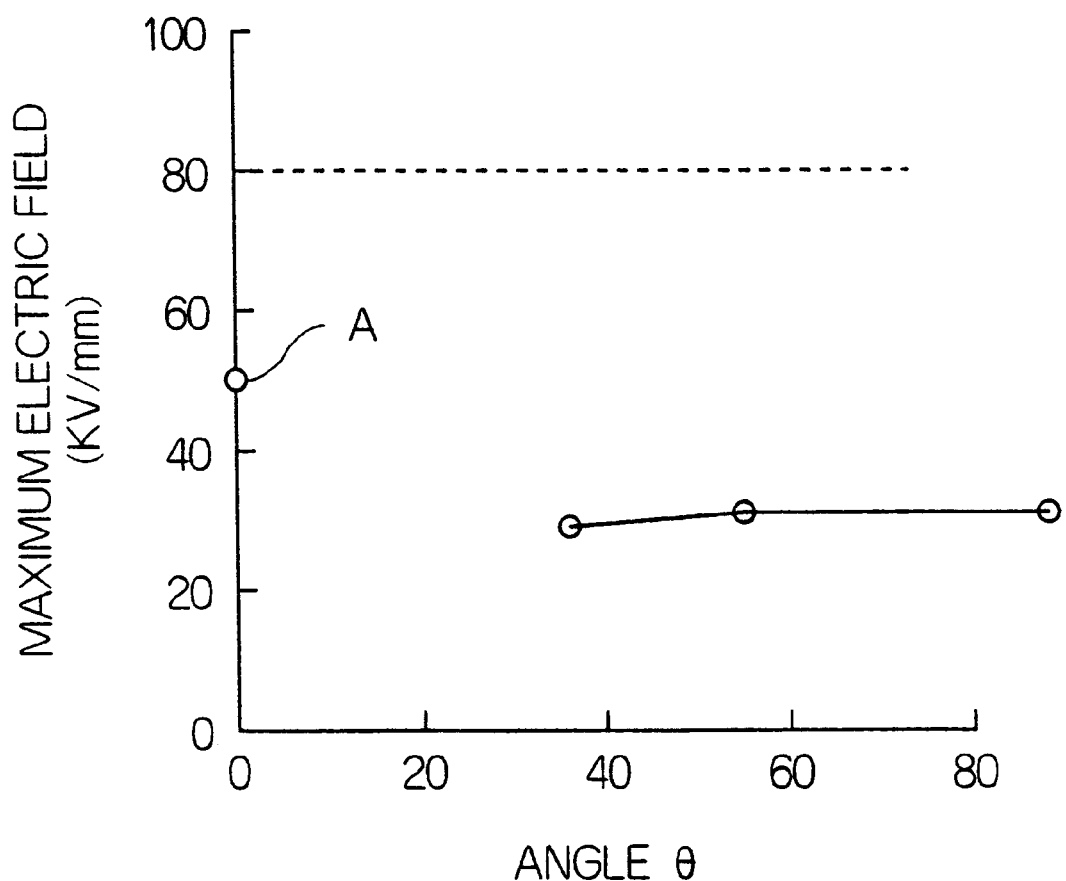
FIG. 7 is a graph illustrating the effects of reducing the electric field, achieved in the circuit board according to the third embodiment of the invention.

FIG. 7 illustrates the effect of the third embodiment of the invention, in which the calculated electric field at the bending corner (contact corner) 23b as a function the bending angle. In this calculation, it is assumed that the thickness of the substrate is 1 mm, the thickness of the electrode is 0.3 mm, the curvature radius r of the edge 23a of the pattern is 0.03 mm, and the curvature radius r of the bending corner 23b is 0.15 mm. In the conventional structure, the maximum electric field at the edge 2a (having a curvature radius r of 0.01 mm) is as large as 80 kV/mm as represented by the broken line in FIG. 7. In contrast, in the bent structure, both the electric field at the end portion 23a of the pattern (denoted by A) and the electric field at the bending corner 23b (denoted by the solid line) are low enough. Thus, the pattern edge structure according to the present embodiment of the invention is effective to suppress concentration of the electric field.

Embodiment 4

Figure 8A:
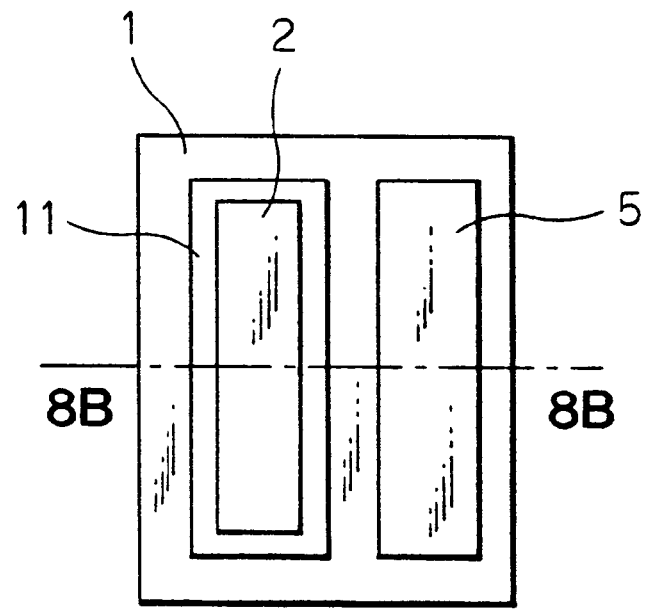
FIG. 8A is a cross-sectional view of a circuit board according to a fourth embodiment of the present invention, in which cross sections of electrode patterns are shown.
Figure 8B:
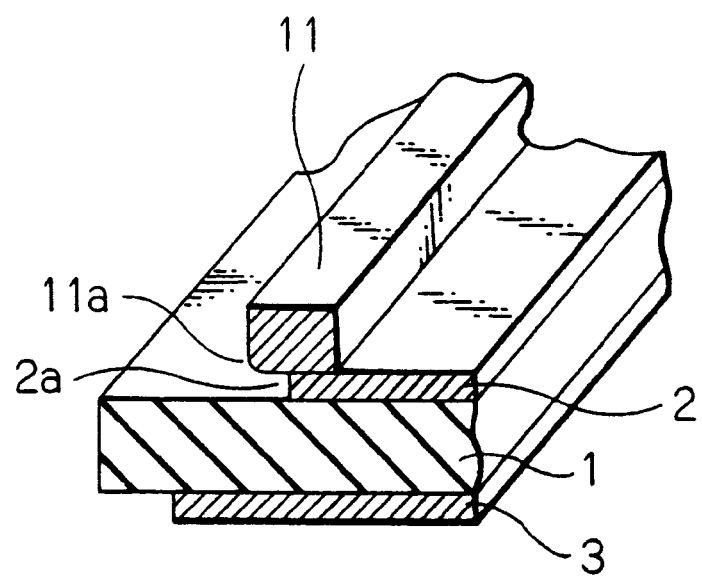
FIG. 8B is an enlarged fragmentary cross-sectional view of FIG. 8A.

FIG. 8A is a plan view of a circuit board according to a fourth embodiment of the invention. FIG. 8B is a perspective view in which the structure is partially cut away along the line 8B—8B of FIG. 8A so that cross sections of electrode patterns are shown. In this fourth embodiment, a shield electrode 11 having a thickness of 1 mm is disposed on each side of an electric circuit pattern 2 serving as a collector electrode. The outer portion of the shield electrode 11 extends outward beyond the end of the electric circuit pattern 2. The shield electrode's surface (edge) 11a facing an insulating substrate 1 is shaped into a round form. The thickness of the electric circuit pattern 2 on which electronic components are to be mounted is usually as small as 0.3 mm. This very small thickness makes it difficult to shape the end portions 2a of the electric circuit pattern itself into a round shape or into a shape having a slanted plane. If the thickness of the electric circuit pattern 2 is increased over the entire electrode, the above difficulty can be avoided. However, the increase in the thickness causes an increase in strain due to thermal stress, and thus this is not a good solution. In this fourth embodiment, the shield electrode 11 having a thickness greater than that of the electrode on which an electronic component is to be mounted is disposed only in the peripheral area of the electric circuit pattern 2 thereby avoiding the strain due to the stress. The shield electrode 11 allows, in effect, an increase in thickness of the end portion of the electrode, and thus it becomes possible to increase the curvature radius r of the edge without the limitation of the thickness of the electric circuit pattern 2 itself. As a result, the electric field concentrated at the end portion 2a of the electrode is dispersed to the edge 11a of the shield electrode 11. As a result, the electric field at the end portion 2a is reduced.

Figure 9:
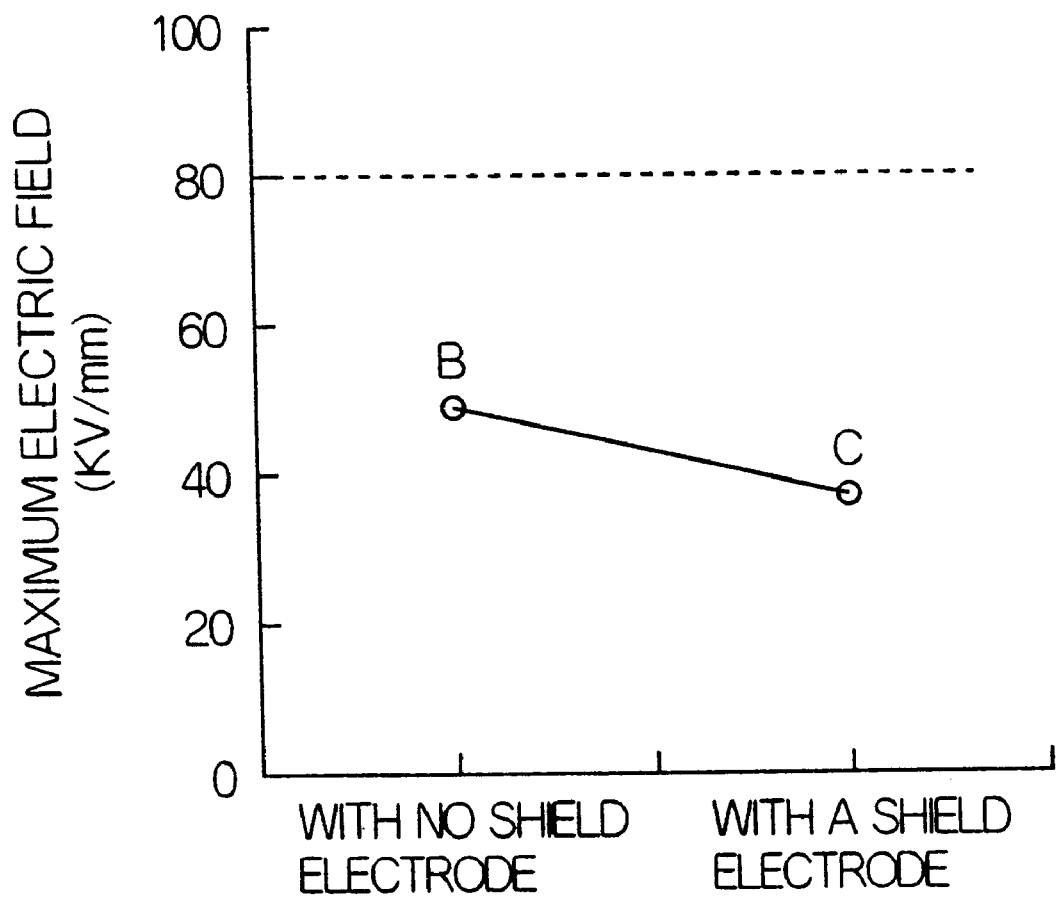
FIG. 9 is a graph illustrating the effects of reducing the electric field, achieved in the circuit board according to the fourth embodiment of the invention.

FIG. 9 illustrates the effect of the shield electrode 11. In this figure, the open circle B denotes the electric field at the end portion 2a (with a curvature radius r of 0.03 mm) whose outward-extending sharp edge in contact with the substrate is removed, while the open circle C denotes the electric field for the structure in which the shield electrode 11 is added to the above structure. The broken line represents the electric field for the conventional structure having a sharp edge 2a (with a curvature radius r of 0.01 mm) shown in FIG. 20. From FIG. 9, it can be seen that the shield electrode 11 is effective to reduce the electric field.

Embodiment 5

Figure 10:
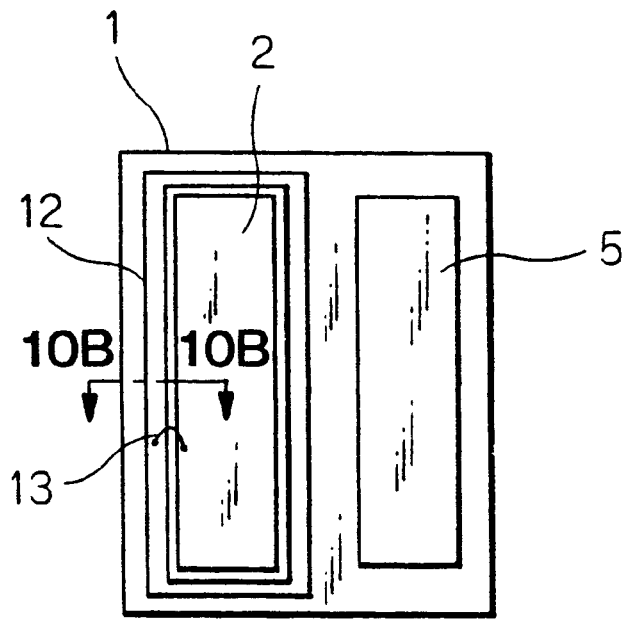
FIG. 10A is a plan view of a circuit board according to a fifth embodiment of the invention.
FIG. 10B is a perspective view of the circuit board of FIG. 10A, a part of the circuit board is cut away along the line 10B—10B of FIG. 10A so that the cross sections of the electrode patterns are shown.
Figure 10:
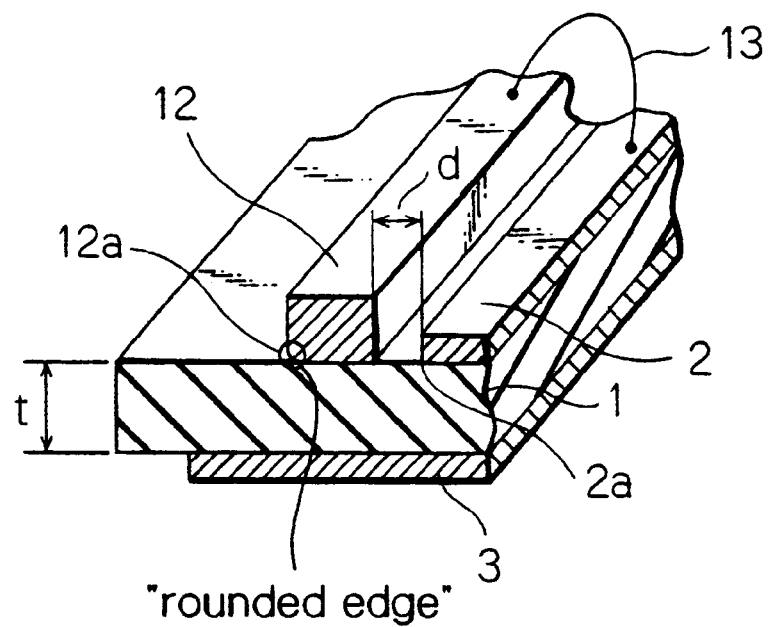
Figure 11:
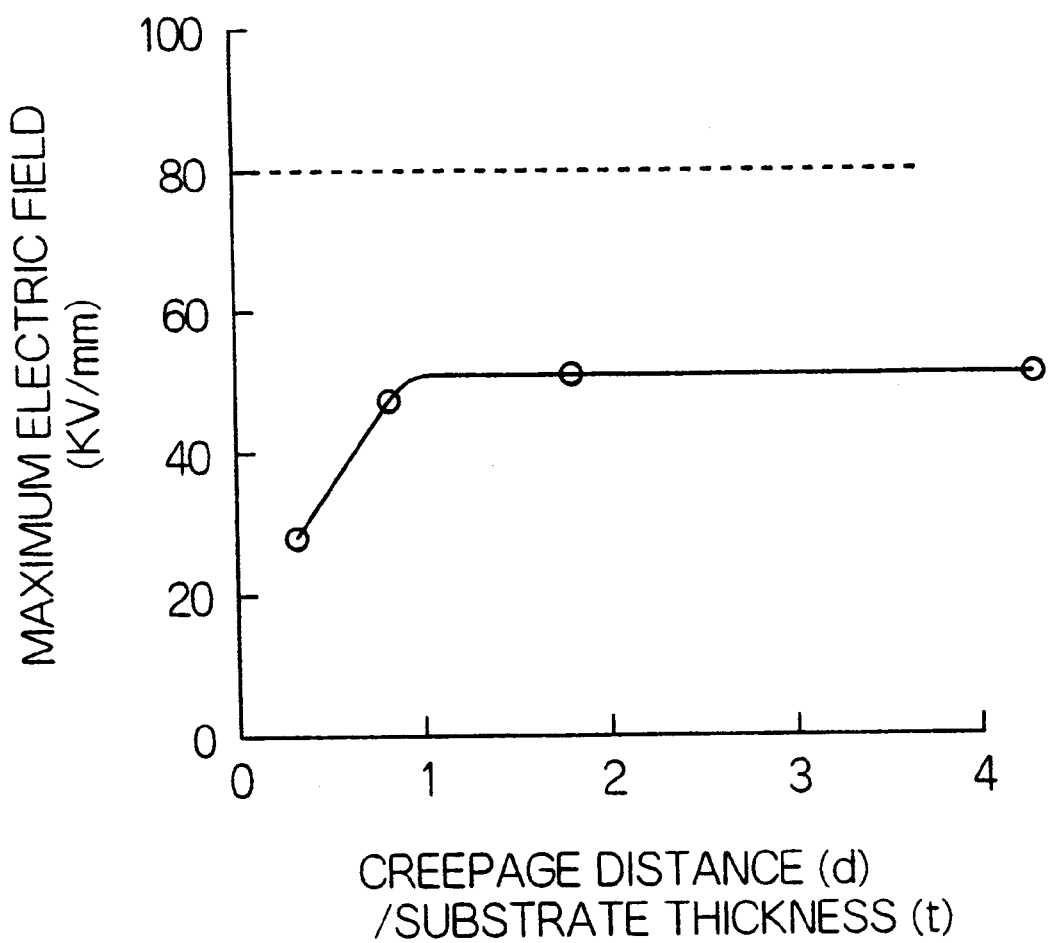
FIG. 11 is a graph illustrating the effects of reducing the electric field, achieved in the circuit board according to the fifth embodiment of the invention.

FIG. 10A is a plan view of a circuit board according to a fifth embodiment of the present invention. FIG. 10B is a perspective view of the circuit board shown in FIG. 10A wherein the structure is partly cut away along the line 10B—10B so that cross sections of electrode patterns are shown. In this fifth embodiment, a guard electrode 12 having a thickness greater than that of an electric circuit pattern 2 serving as a collector electrode for mounting an electronic component is disposed separately from the electric circuit pattern 2, along its periphery area, slightly apart from, i.e., surrounding, the electric circuit pattern 2. The edge 12a of the guard electrode 12, on the outer end near the insulating substrate 1, is shaped into a round form, such as edge 21(a) described with respect to FIG. 1(C). The guard electrode 12 is connected to the electric circuit pattern 2 via a wire 13 so that the guard electrode 12 is maintained at the same electrostatic potential as that of the electric circuit pattern 2. This fifth embodiment can provide similar effects to the fourth embodiment described above. That is, the lines of electric force, which would otherwise be concentrated intensively at the end portion 2a of the electric circuit pattern 2, are also distributed around the edge 12a of the guard electrode 12. As a result, the maximum electric field is reduced. In the fourth embodiment described above, an additional production process is required to connect the shield electrode 11 to the electric circuit pattern 2 in such a manner that the shield electrode 11 is disposed on the end portion of the electric circuit pattern 2. In contrast, in this fifth embodiment, the guard electrode 12 and the electric circuit pattern 2 are connected to the substrate in the same process step. Thus a similar effect of reducing the maximum electric field can be achieved with fewer process steps. The spacing d serving as the creepage distance between the electric circuit pattern 2 and the guard electrode 12 is preferably nearly equal to or less than the thickness t of the insulating substrate 1. FIG. 11 illustrates the maximum electric field on the collector electrode as a function of the spacing d between the guard electrode and the collector electrode. In this calculation, it is assumed that the end portion 2a has a curvature radius r of 0.03 mm after removing the outward-extending sharp edge in contact with the substrate, and that the edge of the guard electrode 12 on the outer end near the insulating substrate 1 has a curvature radius r of 0.5 mm. The broken line represents the maximum electric field for the conventional structure having a sharp edge 2a (with a curvature radius r of 0.01 mm). As can be seen from FIG. 11, although the maximum electric field is rather great when the spacing d is larger than the thickness t of the insulating substrate, the maximum electric field decreases abruptly with the decreasing spacing d when the spacing d is less than the substrate thickness t. Thus, if the spacing d is set to a value less than the thickness t of the substrate, then it is possible to achieve a great reduction in the maximum electric field.

Embodiment 6

Figure 12:
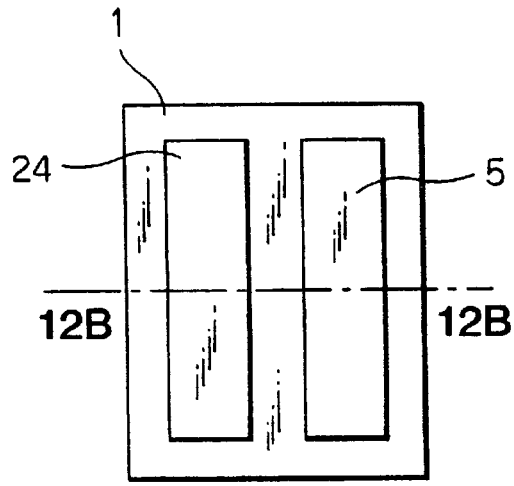
FIG. 12A is a plan view of a circuit board according to a sixth embodiment of the invention.
FIG. 12B is a cross-sectional view of the circuit board of FIG. 12A, which is taken along the line 12B—12B of FIG. 12A so that the cross sections of the electrode patterns are shown.
Figure 12:
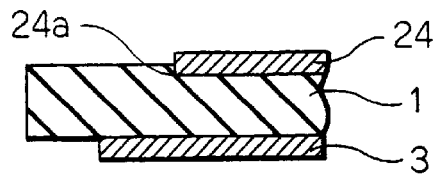

FIG. 12A is a plan view of a circuit board according to a sixth embodiment of the invention. FIG. 12B is a cross-sectional view of the circuit board of FIG. 12A taken along the line 12B—12B, in which cross sections of electrode patterns are shown. In this sixth embodiment, a recessed portion having a similar shape to that of an electric circuit pattern 24 serving as a collector electrode is formed on an insulating substrate 1, and the electric circuit pattern 24 is disposed in the vertically-recessed portion so that a half thickness of electric circuit pattern 24 is embedded in the recessed portion. In general, a partial discharge occurs at an edge of an electrode in a space filled with a gas ambient. In this embodiment, as shown in FIG. 12B, the collector electrode is embedded in the substrate so that the gas space is eliminated from the region near the pattern edge 24a of the electric circuit pattern 24 where a high electric field is concentrated, thereby suppressing discharge.

Figure 13:
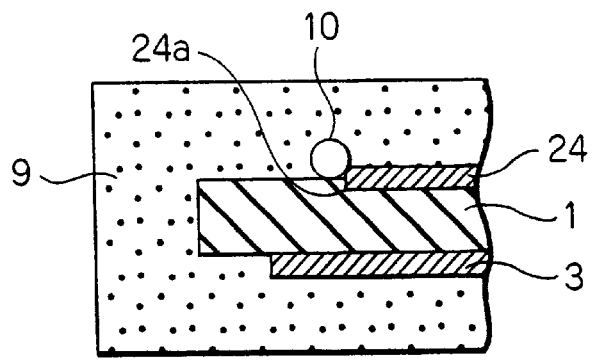
FIG. 13 is a cross-sectional view of the circuit board according to the sixth embodiment of the invention, wherein a void is present near an edge of an electrode pattern.

FIG. 13 is a cross-sectional view illustrating a circuit board according to the sixth embodiment of the invention, covered with a silicone gel 9 including a void 10. In this structure, the edge 24a of the electric circuit pattern 24 at which the electric field has a highest value is covered with ceramic. As a result, even if a void 10 is produced in the gel 9, the void 10 will be apart from the pattern edge 24a at which a high electric field is concentrated. Thus, the void 10 will not cause a reduction in the starting voltage of partial discharge. In this embodiment of the invention, as described above, no voids which can cause discharge are produced near the region in which a high electric filed is present.

In an alternative mode, the entire thickness of collector electrode may be embedded in the substrate 1 so that the upper surface of the electric circuit pattern 24 is flush with the surface of the insulating substrate 1 without any portion of the pattern 24 extending outward beyond the surface of the insulating substrate 1.

Embodiment 7

Figure 14:
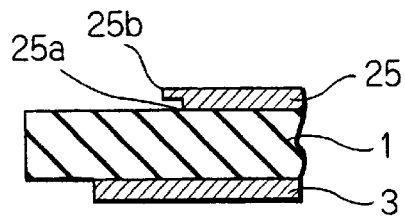
FIG. 14A is a cross-sectional view of a circuit board according to a seventh embodiment of the present invention, in which cross sections of electrode patterns are shown.
FIG. 14B is an enlarged fragmentary cross-sectional view of FIG. 14A.
Figure 14:
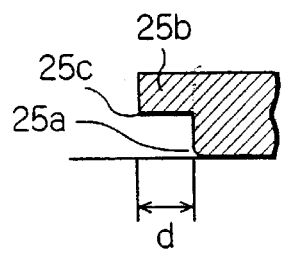

FIG. 14A is a cross-sectional view of a circuit board according to a seventh embodiment of the invention, and FIG. 14B is an enlarged fragmentary cross-sectional view of FIG. 14A. In this embodiment, a step is formed in an electrode. That is, the surface of an electric circuit pattern 25 serving as a collector electrode in contact with an insulating substrate 1 is partially removed so that a step is formed. The end 25a of the electrode surface in contact with the substrate 1 is covered by an upper portion 25b protruding outward. Thus the end 25a of the electrode is located at an inner position of a laterally-recessed region. As a result, lines of electric force are distributed both to the end portion 25a of the electrode and to the end 25c of the upper protruding portion. As a result, the concentration of the electric field at the end portion 25a is relaxed.

Figure 15:
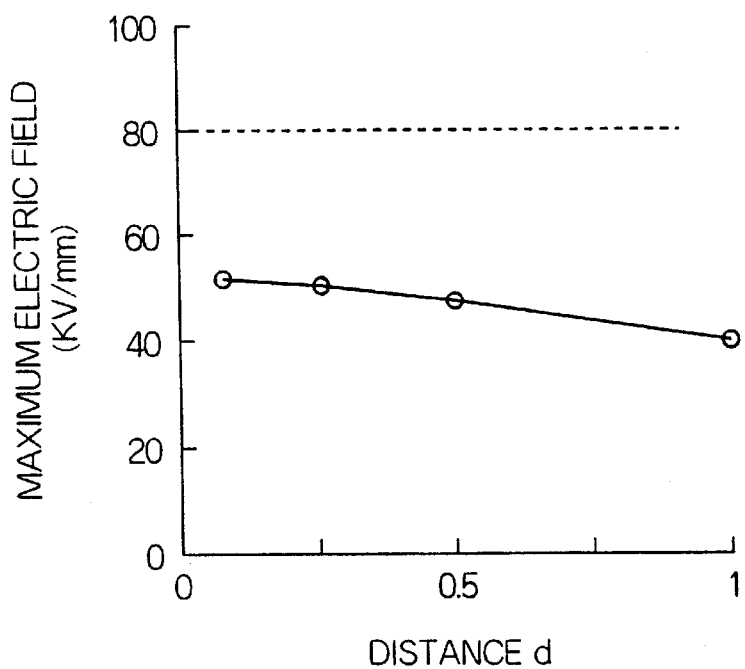
FIG. 15 is a graph illustrating the effects of reducing the electric field, achieved in the circuit board according to the seventh embodiment of the invention.

FIG. 15 illustrates the reduction in the maximum electric field achieved by the above-described structure according to the present embodiment. In this calculation, it is assumed that a step is formed in the electrode having a thickness of 0.3 mm by reducing the thickness of the end portion to half the main part. It is also assumed that the curvature radius r of the end portion 25a of the contact face is 0.03 mm. As can be seen from FIG. 15, the maximum electric field decreases with the increasing distance d between the end 25c of the upper protruding portion 25b and the end 25a of the contact face. In other words, if the end 25a of the contact face is located at a laterally deeper location, the maximum electric field decreases to a lower level. In FIG. 15, the broken line represents the maximum electric field for the conventional structure having a sharp edge 2a (with a curvature radius r of 0.01 mm) shown in FIG. 20.

The step for the above-described purpose can be formed by using a cutting die having a step corresponding to the step to be formed. Alternatively, the step may also be formed by cutting the end portion of the electric circuit pattern after obtaining the electric circuit pattern by means of die-cutting. The technique disclosed here in the seventh embodiment according to the invention may also be applied to the shield electrode 11 employed in the fourth embodiment described above to increase the effective thickness of the peripheral portion of the electric circuit pattern.

Embodiment 8

Figure 16:
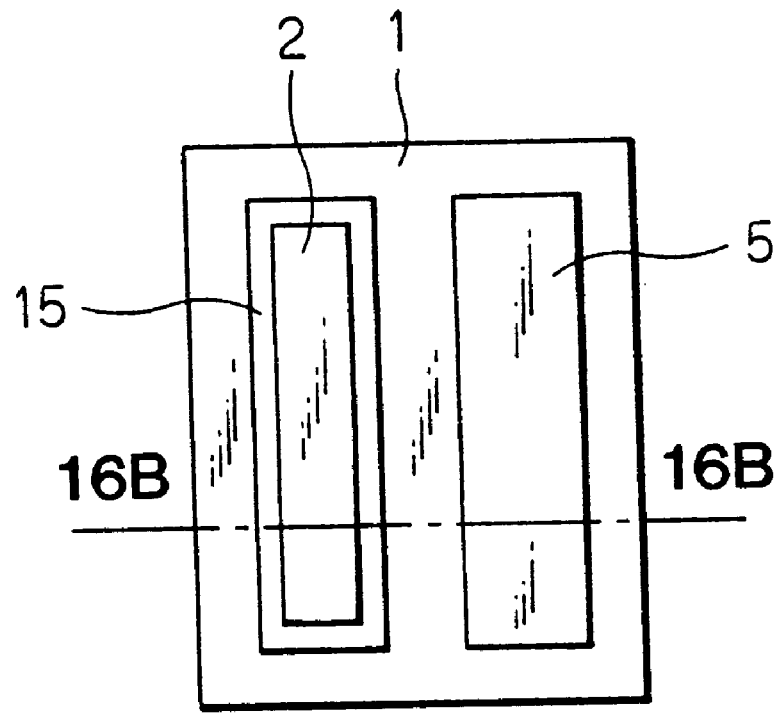
FIG. 16A is a plan view of a circuit board according to an eighth embodiment of the invention.
FIG. 16B is a cross-sectional view of the circuit board of FIG. 16A, which is taken along the line 16B—16B of FIG. 16A so that the cross sections of the electrode patterns are shown.
Figure 16:
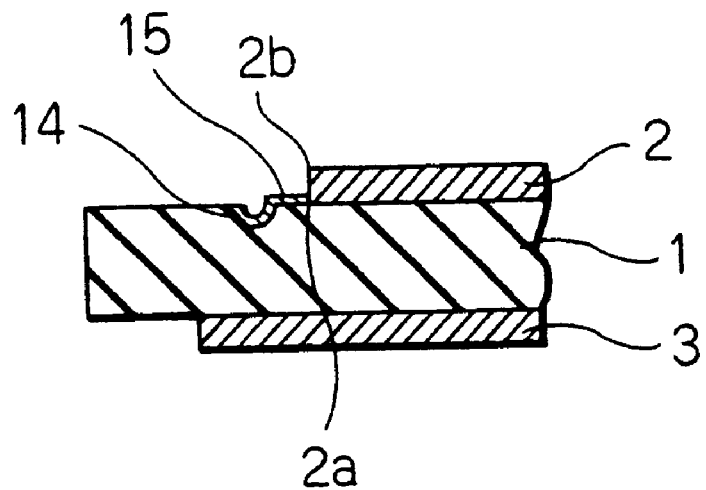
Figure 17A:
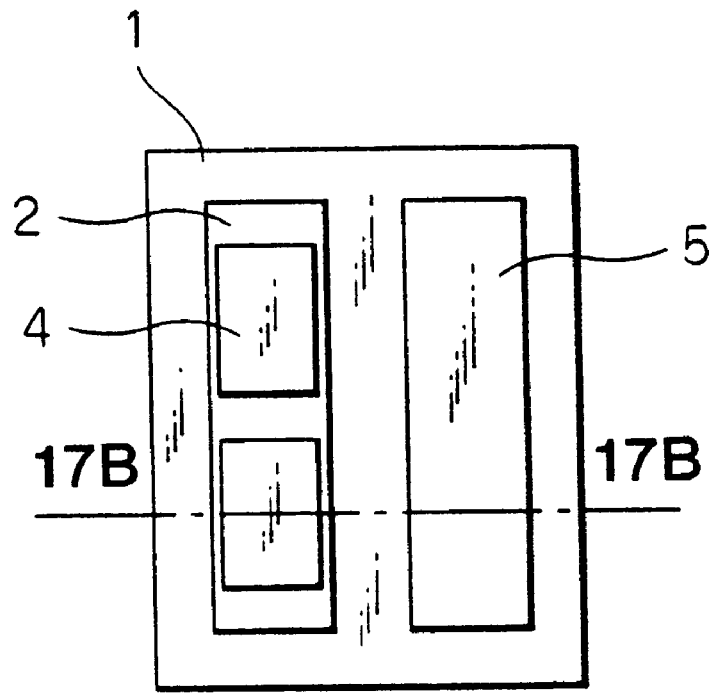
FIG. 17A is a plan view of a conventional circuit board.
Figure 17B:
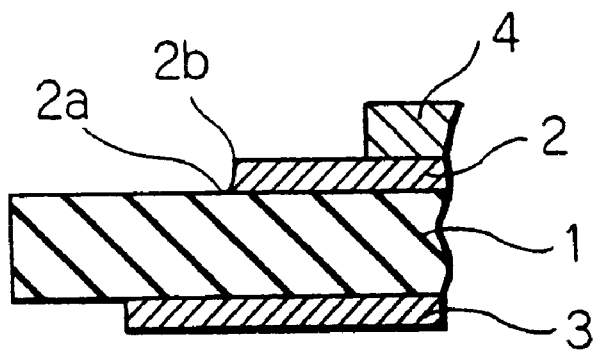
FIG. 17B is a cross-sectional view of the circuit board of FIG. 17A, which is taken along the line 17B—17B of FIG. 17A so that the cross sections of the electrode patterns are shown.
Figure 18:
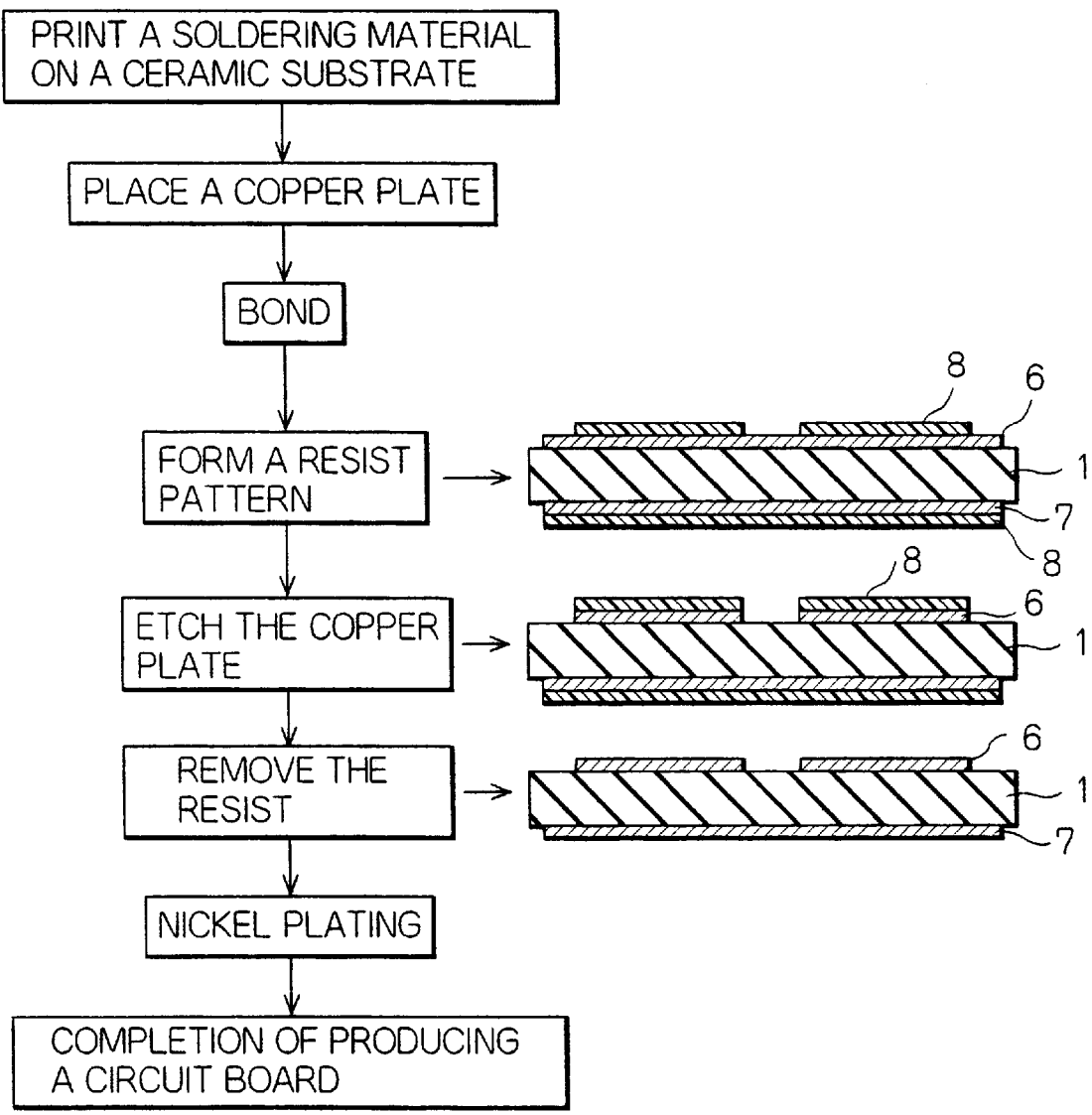
FIG. 18 is a flow chart incorporated with some cross-sectional views, illustrating an example of a method of producing the conventional circuit board.
Figure 19:
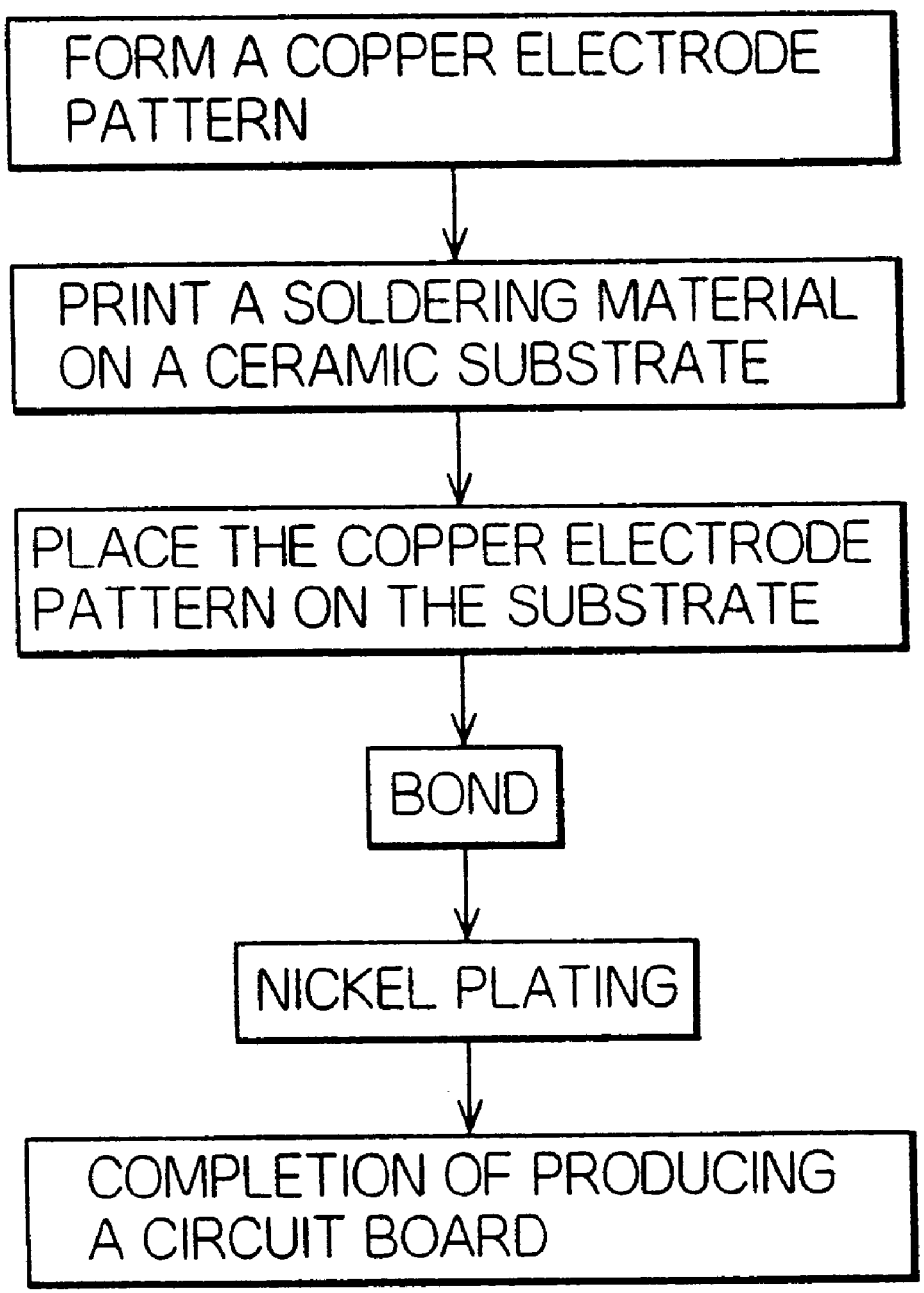
FIG. 19 is a flow chart illustrating another example of a method of producing the conventional circuit board.

FIG. 16A is a plan view of a circuit board according to an eighth embodiment of the invention, and FIG. 16B is a cross-sectional view of the circuit board of FIG. 16A, which is taken along the line 16B—16B so that cross sections of electrode patterns are shown. In this embodiment, a groove 14 is formed on an insulating substrate 1 in such a manner that an electric circuit pattern 2 serving as a collector electrode is surrounded by the groove 14. Furthermore, the bottom surface of the groove 14 and the end portion 2a of the electric circuit pattern 2 are covered with a conductive film 15. The conductive film 15 may be formed by evaporating a metal material or coating a conductive paste. In contrast to the conventional structure in which a high electric field is concentrated at the end portion 2a, the end portion 2a, in the structure according to the present embodiment, is flattened by the conductive film 15 covering the end portion 2a, and thus the electric field is reduced. Furthermore, the bottom of the groove 14 is formed into a shape gradually curved toward the ground plane 3 so that the concentration of the electric field is reduced.

Although in the specific embodiments described above an aluminum nitride ceramic substrate is employed as the insulating substrate 1, other types of ceramic substrates or insulating substrates made up of a material other than ceramic may also be employed. In any case, the maximum electric field is reduced, and the starting voltage of partial discharge is increased.

In the embodiments described above, a conductive layer disposed on one surface of an insulating substrate serves as an electric circuit pattern and a conductive layer on the other surface serves as a ground electrode. Alternatively, conductive layers on both surfaces may be electric circuit patterns. Furthermore, the electric circuit pattern is not limited to collector and emitter electrodes employed in the specific embodiments described above, and the present invention may also be applied to various types of circuit patterns. Furthermore, in the specific embodiments described above, since the emitter electrode is not subjected to a high voltage, only the collector electrode is processed so that its end portion has a round shape or a slanted plane so as to reduce the maximum electric field. However, the emitter electrode may also be subjected to a process similar to the collector electrode.

In the case where the circuit board includes a conductive layer having a ring-shaped electric circuit pattern, the conductive layer is formed in such a manner that at its inner periphery the end of the surface in contact with a substrate does not project outward but is located at a laterally-recessed position. In this case, the end of the contact face is not located at an inner position in a laterally-recessed region at the outer peripheral of the conductive layer. However, it should be understood that such a structure also falls within the scope of the invention.

As described above, in the first mode of the invention, the circuit board includes a conductive layer serving as an electric circuit pattern formed on an insulating substrate wherein the end portion of the conductive layer is shaped into a gradually-curved surface, a slanted surface, or a step so that an end of the conductive layer's contact face in contact with the insulating substrate is located at an inner position relative to the outermost end of the conductive layer, thereby reducing the concentration of a high electric field on the circuit board and thus increasing the dielectric breakdown voltage as well as the starting voltage of partial discharge. As a result, the reliability of the circuit board is improved.

Furthermore, in the circuit board according to the second mode of the invention, the conductive layer serving as the electric circuit pattern is formed in such a manner that the thickness of its periphery is greater than that of the inner portion so that the concentration of a high electric field on the circuit board is further reduced and the dielectric breakdown voltage as well as the starting voltage of partial discharge is increased. As a result, the reliability of the circuit board is improved.

Still furthermore, in the circuit board according to the third mode of the invention, the conductive layer serving as the electric circuit pattern includes: an electric circuit pattern electrode; and a guard electrode in the form of a frame disposed at a location surrounding the electric circuit pattern electrode by a distance, as measured along the surface of the insulating substrate, equal to or smaller than the thickness of the insulating substrate, the guard electrode having a shape in cross section in which an end of its contact face in contact with the insulating substrate is located at an inner position relative to the outermost end of the guard electrode, the guard electrode being electrically connected to the electric circuit pattern electrode. Thus, the concentration of a high electric field on the circuit board is further reduced and the dielectric breakdown voltage as well as the starting voltage of partial discharge is increased. As a result, the reliability of the circuit board is improved.

In the circuit board according to the fourth mode of the invention, a recessed groove in the form of a frame is provided on the insulating substrate, the groove being located outside the conductive layer serving as the electric circuit pattern and surrounding the conductive layer serving as the electric circuit pattern; and a conductive film disposed on the insulating substrate, the conductive film covering the bottom surface of the groove and the area between the conductive layer serving as the electric circuit pattern and the groove. Thus, the concentration of a high electric field on the circuit board is reduced and the dielectric breakdown voltage as well as the starting voltage of partial discharge is increased. As a result, the reliability of the circuit board is improved.

In the circuit board according to the fifth mode of the invention, the conductive layer serving as the electric circuit pattern is embedded in the insulating substrate so as to be partially exposed to the outside thereby preventing a void from being formed near a region in which a high electric field is concentrated. Thus, partial discharge is suppressed and the reliability of the circuit board is improved.

In the method of producing a circuit board according to the present invention, a circuit board including a conductive layer serving as an electric circuit pattern having a shape in cross section in which an end of the conductive layer's contact face in contact with an insulating substrate is located at an inner position relative to the outermost end of the conductive layer is produced by the process including the step of electrolytic polishing the periphery of the conductive layer serving as the electric circuit pattern so as to remove an edge portion of the contact face. According to this production method, it is easy to remove sharp edges and thus it is possible to easily obtain a gradually-curved shape in the cross section of the conductive layer serving as the electric circuit pattern.

What is claimed is:

1. A circuit board comprising:

an insulating substrate having opposed first and second surfaces and a thickness;

first and second conductive layers disposed on the first and second surfaces of said insulating substrate, respectively, wherein the first conductive layer has an end surface projecting outwardly from said first conductive layer, in a direction generally parallel to the first surface of said insulating substrate, and a contact surface in contact with said insulating substrate and joining the end surface at a junction, and the end surface is spaced from the first surface of said insulating substrate except at the junction, the first conductive layer being a guard electrode; and an electrically conductive electric circuit pattern disposed on the first surface and spaced from the guard electrode by a distance, measured along the first surface, no larger than the thickness of the insulating substrate, the guard electrode surrounding the electric circuit pattern.

2. The circuit board according to claim 1 wherein the end surface includes a rounded portion adjacent the junction.

3. The circuit board according to claim 1 including a wire electrically connecting the guard electrode to the electrically conductive circuit pattern.

4. A circuit board comprising:

an insulating substrate having opposed first and second surfaces and a thickness;

first and second conductive layers disposed on the first and second surfaces of said insulating substrate, respectively, wherein the first conductive layer has an end surface projecting outwardly from said first conductive layer, in a direction generally parallel to the first surface of said insulating substrate, and a contact surface in contact with said insulating substrate and joining the end surface at a junction, and the end surface is spaced from the first surface of said insulating substrate except at the junction, the first conductive layer being a guard electrode; and an electrically conductive electric circuit pattern disposed on the first surface and spaced from the guard electrode by a distance, measured along the first surface, no larger than the thickness of the insulating substrate, wherein the guard electrode is thicker than the electrically conductive circuit pattern.

5. The circuit board according to claim 4 including a wire electrically connecting the guard electrode to the electrically conductive circuit pattern.

6. The circuit board according to claim 4 wherein the end surface includes a rounded portion adjacent to the junction.

* * * * *